(12) United States Patent
Poelzl

(10) Patent No.: US 8,637,367 B2
(45) Date of Patent: Jan. 28, 2014

(54) METHOD FOR PRODUCING AN INSULATION LAYER BETWEEN TWO ELECTRODES

(75) Inventor: Martin Poelzl, Ossiach (AT)

(73) Assignee: Infineon Technologies AG, Neubiberg (DE)

(*) Notice: Subject to any disclaimer, the term of this patent is extended or adjusted under 35 U.S.C. 154(b) by 74 days.

(21) Appl. No.: 13/207,056

(22) Filed: Aug. 10, 2011

(65) Prior Publication Data

US 2012/0037979 A1 Feb. 16, 2012

(30) Foreign Application Priority Data

Aug. 12, 2010 (DE) .................... 10 2010 034 116

(51) Int. Cl.
*H01L 21/336* (2006.01)

(52) U.S. Cl.
USPC ........... 438/259; 438/270; 438/589; 257/330; 257/331

(58) Field of Classification Search
None
See application file for complete search history.

(56) References Cited

U.S. PATENT DOCUMENTS

| 6,319,777 | B1 * | 11/2001 | Hueting et al. | 438/270 |
| 7,091,573 | B2 | 8/2006 | Hirler et al. | |
| 8,310,001 | B2 * | 11/2012 | Darwish et al. | 257/330 |
| 2009/0057754 | A1 * | 3/2009 | Kraft et al. | 257/328 |

* cited by examiner

*Primary Examiner* — Tan N Tran
*Assistant Examiner* — Scott R Wilson
(74) *Attorney, Agent, or Firm* — Infineon Technologies AG Patent Department

(57) ABSTRACT

Method for producing an insulation layer between a first electrode and a second electrode in a trench of a semiconductor body, wherein the method comprises the following features: providing a semiconductor body with a trench formed therein, wherein a first electrode is formed in a lower part of the trench, producing an insulation layer on the first electrode and at the sidewalls of the trench in an upper part of the trench in such a way that the insulation layer is formed in a U-shaped fashion in the trench, producing a protective layer on the insulation layer at least at the bottom of the remaining void in the trench, removing the insulation layer at the sidewalls of the trench in the upper part of the trench, removing the protective layer, producing a second electrode at least on the insulation layer above the first electrode.

19 Claims, 5 Drawing Sheets

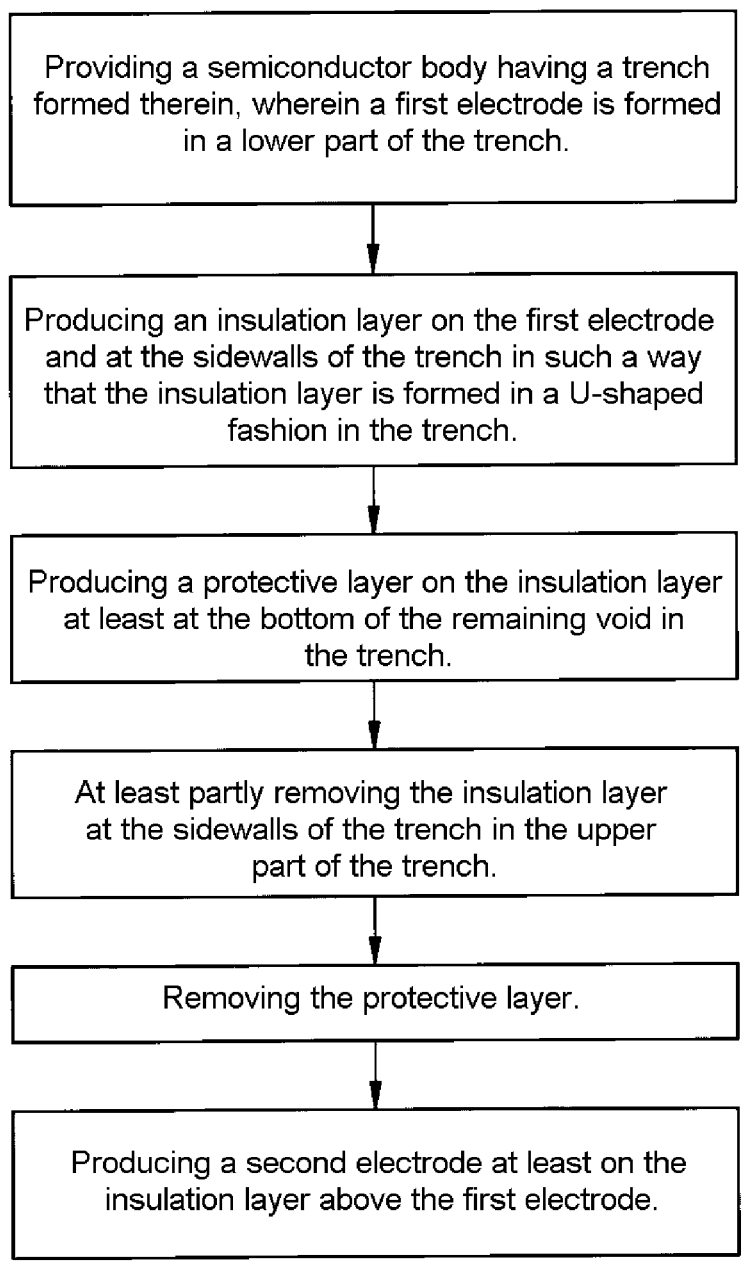

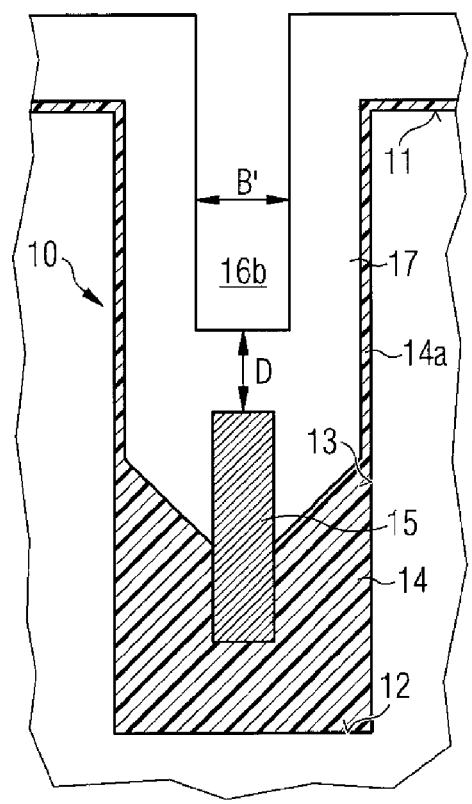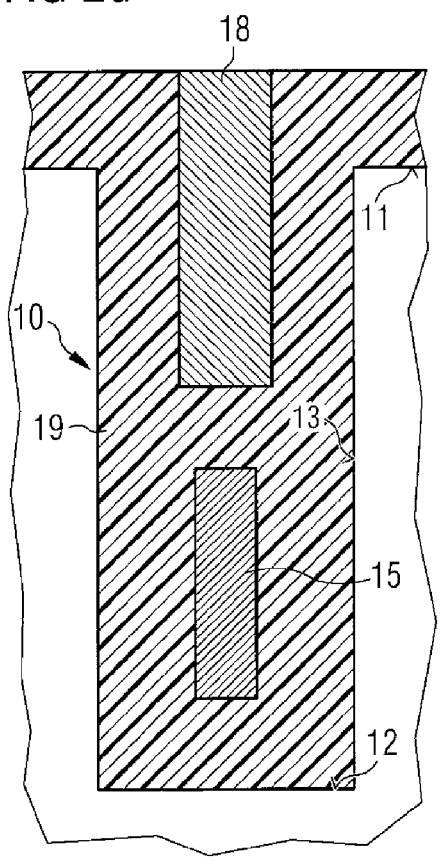

METHOD FOR PRODUCING AN INSULATION LAYER BETWEEN TWO ELECTRODES

RELATED APPLICATIONS

This Application claims priority benefit of German Patent Application 102010034116.9, which was filed on Aug. 12, 2010. The entire contents of the German Patent Application are hereby incorporated herein by reference.

BACKGROUND

Ever more stringent requirements with regard to the reduction of switching losses are made of power semiconductor components. In the case of MOSFETs, in particular, a significant proportion of the switching losses is caused by parasitic capacitances. In order to reduce the parasitic gate-drain capacitance, therefore, the overlap region between the gate electrode and drain region is kept as small as possible. As an example of this, reference is made to the so-called "dual-poly" concept, wherein a gate electrode and a field electrode are arranged in a trench MOSFET.

In the "dual-poly" concept, however, an additional parasitic capacitance is manifested between the gate electrode and the field electrode and, in the case of a high field electrode resistance, can lead to the gate electrode being coupled to the field electrode. In the case of a so-called "buck converter", for example, this fosters a situation in which the MOSFET is switched on again at the low-voltage terminal. However, this process of switching on again would lead to additional switching losses. Consequently, there is the requirement for providing a "dual-poly" content having a low gate-field electrode capacitance. This can be achieved, for example, by means of a thick dielectric layer (insulation layer) between the gate electrode and the field electrode. However, the production of such a thick dielectric layer (insulation layer) proves to be difficult on account of the structural boundary conditions in the case of a power semiconductor component.

There is a need to provide a method for producing a thick insulation layer between two electrodes in the trench of a semiconductor body.

BRIEF DESCRIPTION OF THE FIGURES

FIG. 1 shows an exemplary temporal sequence of the method according to the invention.

DETAILED DESCRIPTION

Figure 2A:
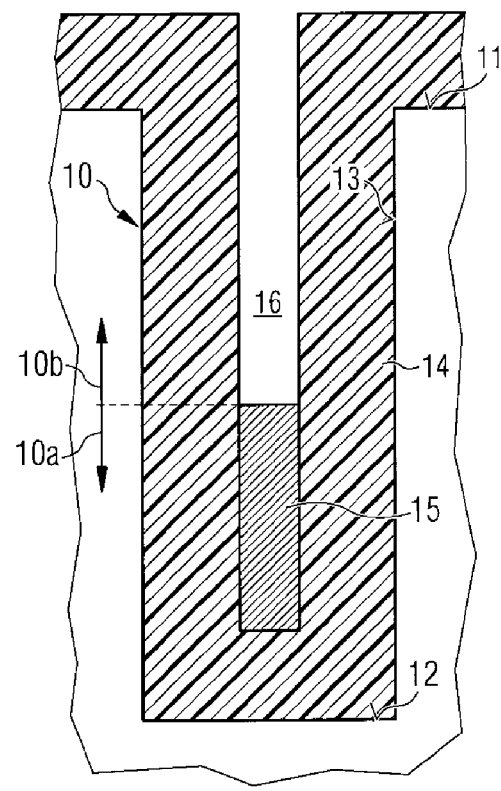
FIG. 2 shows cross-sectional views a to g of selected intermediate results of one embodiment of the method.

A method for producing an insulation layer between a first electrode and a second electrode in a trench of a semiconductor body, the method comprising: providing a semiconductor body with a trench formed therein, wherein a first electrode is formed in a lower part of the trench, producing an insulation layer on the first electrode and at the sidewalls of the trench in an upper part of the trench in such a way that the insulation layer is formed in a U-shaped fashion in the trench, producing a protective layer on the insulation layer at least at the bottom of the remaining void in the trench, and removing the insulation layer at the sidewalls of the trench in the upper part of the trench, removing the protective layer, producing a second electrode at least on the insulation layer above the first electrode.

The use of the protective layer makes it possible to produce a thick insulation layer between the two electrodes lying one above another. The protective layer prevents the removal of the insulation layer above the first electrode during a step of removing the insulation layer at other locations. The protective layer therefore retains the originally produced insulation layer of the first electrode. An insulation layer thickness produced in a defined manner is thus maintained between the two electrodes. The method thus makes it possible, by producing an insulation layer having a thickness set in a targeted manner, to realize a low field electrode-gate electrode coupling capacitance reliably and in a manner that can be set with high precision.

One embodiment of the invention provides for the production of the insulation layer to be effected by deposition of an insulation material on the first electrode and at the sidewalls of the trench. The deposition process makes it possible to produce a thick insulation layer in a simple manner. A TEOS (tetraethoxysilane) deposition is particularly suitable for this purpose. One advantageous configuration of the method is if the production of the insulation layer in the trench is effected conformally, since this significantly simplifies the further method implementation, in particular the production of the second electrode, in a desired manner.

In one exemplary embodiment of the invention, the protective layer is produced from a material which can be etched selectively with respect to the insulation layer. Consequently, the insulation layer can be removed selectively relative to the protective layer and also relative to the semiconductor body, and the protective layer can likewise be removed selectively with respect to the insulation layer, such that the thick insulation layer can be produced at the preferred locations between the two electrodes. Selective etchability is present if two materials have an etching rate in the ratio of ≥10:1 with the same etch, that is to say that one material is etched at least ten times faster than the other material.

Further embodiments of the invention provide, for example, for the protective layer to be produced from a carbon-containing material and, in particular, for the carbon-containing material to be carbon or a polymer.

In one embodiment variant of the invention, the protective layer is not only produced at the bottom of the remaining void in the trench, rather the protective layer completely fills the remaining void in the trench. As a result, the protective layer can be produced particularly simply by, for example, the process of filling with a liquid resist.

The method according to the invention is suitable, in particular, for producing insulation layers having a thickness D≥200 nm.

Exemplary embodiments of the invention are explained in greater detail below with reference to the accompanying figures. However, the invention is not restricted to the embodiments specifically described, but rather can be modified and altered in a suitable manner. It lies within the scope of the invention to combine individual features and feature combinations of one embodiment with features and feature combinations of another embodiment in a suitable manner in order to arrive at further embodiments according to the invention.

Before the exemplary embodiments of the present invention are explained in greater detail below with reference to the figures, it is pointed out that identical elements in the figures are provided with the same or similar reference symbols, and that a repeated description of said elements is omitted. Furthermore, the figures are not necessarily true to scale; rather, the main emphasis is on elucidating the basic principle.

FIG. 1 illustrates a temporal sequence of one exemplary embodiment of the method. A first step involves providing a semiconductor body having a trench formed therein, wherein a first electrode is formed in a lower part of the trench. In a subsequent step, an insulation layer is produced on the first electrode and at the sidewalls of the trench in such a way that the insulation layer is formed in a U-shaped fashion in the trench.

A further step thereupon involves producing a protective layer on the insulation layer at least at the bottom of the remaining void in the trench.

This is followed by at least partly removing the insulation layer at the sidewalls of the trench in the upper part of the trench.

After this step, the protective layer is removed.

Afterwards, a second electrode is also produced at least on the insulation layer above the first electrode.

The individual steps mentioned above are not necessarily strung together temporally directly. However, intermediate steps (not mentioned here) can also be provided, such as, for example, the formation of a gate oxide at the sidewalls.

A further exemplary embodiment of the method, which fits into the temporal sequence in FIG. 1, is illustrated in the selected individual steps with reference to FIGS. 2a to 2g.

FIG. 2a shows, in a schematic cross-sectional view, a trench 10 produced in a semiconductor body. In this case, the trench 10 produced in the semiconductor body extends from a surface 11 of the semiconductor body at least virtually perpendicularly into the semiconductor body. A thick field dielectric 14 is formed both at the bottom 12 of the trench and at the sidewalls 13 and on the surface 11 of the semiconductor body, said field dielectric usually being deposited from the gas phase and being an SiO2 layer, for example.

A first electrode 15 (field electrode) is formed on said thick field dielectric 14 in the lower part 10a of the trench 10. The first electrode 15 can be produced, for example, from doped polycrystalline silicon or from some other conductive material. For this purpose, usually the remaining trench on the thick field dielectric is filled with the conductive electrode material and the electrode is subsequently formed by the removal of the electrode material in an upper part 10b of the trench. In this case, the removal can be effected by means of a corresponding photo technology for the masking of the surface 10 and a selective etch of the electrode material. After the removal of the mask, generally a resist layer, the intermediate result as illustrated in FIG. 2a is obtained.

A typical width between the trench sidewalls 13 for such an electrode is approximately 300 nm, for example. The electrode thus produced completely fills the remainder of the lower part 10a of the trench 10 between the thick field dielectric 14. In the upper part 10b of the trench 10, by contrast, a void 16 remains in the trench 10 between the thick field dielectric 14.

Figure 2B:
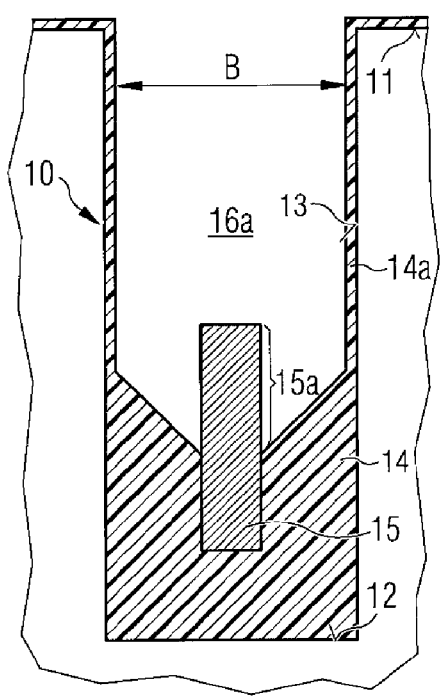

FIG. 2b shows, in a schematic cross-sectional view, the state in the trench 10 after the thick field dielectric has been removed apart from a thin residual layer 14a at the surface 11 and at the sidewalls 13 in the upper part 10b of the trench. The residual layer 14a can either be produced by incomplete removal of the thick field dielectric 14 or, alternatively, the residual layer 14a can also be formed by renewed production after the complete removal of the field dielectric 14 in the upper part 10b of the trench 10 on the sidewalls 13, for example by thermal oxidation. In a further embodiment, the residual layer 14a can also be completely removed, such that only the bare sidewalls 13 of the semiconductor body remain in the upper part 10b of the trench 10 after the removal of the thick field dielectric 14.

The at least partial removal of the thick field dielectric 14 in the upper part 10b of the trench 10 and at the surface 11 of the semiconductor body is generally effected by means of a wet-chemical etching method. However, this also removes part of the thick field dielectric 14 in the lower part 10a of the trench between the field electrode 15 and the sidewall 13 in a triangular fashion. Consequently, an upper part 15a of the field electrode 15 extends into the enlarged void 16a thus created within the trench 10. The enlarged void 16a has a width B corresponding at most to the trench width.

FIG. 2c shows a state in the method sequence after the production of an insulation layer 17 in the enlarged void 16a on the first electrode 15 and at the sidewalls 13 of the trench 10 in the upper part 10b of the trench 10 in such a way that the insulation layer 17 is formed in a U-shaped fashion in the trench 10. Consequently, a reduced void 16b remains in the trench 10 between the insulation layer 17.

The production of the insulation layer 17, generally an SiO2 layer, is effected by means of a deposition method, for example. In this case, the insulation layer 17 is thus produced by deposition of the insulation material on the first electrode 15 and at the sidewalls 13 of the trench 10. In this case, by way of example, the TEOS (tetraethyl orthosilicate) deposition method or a silane-based deposition method can be mentioned as a suitable deposition method. It is advantageous if the production of the insulation layer is effected conformally to an extent such that a continuous insulation layer also arises for example in the region along the upper part 15a of the first electrode 15 and on the field dielectric 14. The insulation layer 17 above the first electrode 15 generally has at least a thickness D≥200 nm, in order to ensure a sufficient reduction of the parasitic capacitance between the first and the second electrode. The maximum thickness D that can be achieved is limited by the width B of the void 16a and follows the relationship D<½B. In order to ensure the possibility for forming a protective layer 18 on the insulation layer 17 within the trench 10 in the case of a conformal deposition of the insulation layer 17 in the trench 10, however, a remaining void 16b having a width B' is required. The maximum thickness D of the insulation layer 17 that can be achieved then follows the relationship D≥½B-B'.

In some embodiments, the width B' can be 50 nm, for example, and the width B 500 nm, for example, and so the maximum thickness D of the insulation layer 17 would be 200 nm in this exemplary embodiment.

FIG. 2d shows an intermediate result in the method for producing an insulation layer between a first electrode and a second electrode after a protective layer 18 has been produced on the insulation layer 19 in the remaining void 16b of the trench 10. In this case, in the example shown, the insulation layer 19 is composed of the original field dielectric 14, the possibly remaining or newly produced residual layer 14a and the insulation layer 17. Particularly if the employed materials of the individual layers 14, 14a and 17 are identical, the boundaries of these individual layers virtually completely disappear, which is illustrated schematically by a uniform insulation layer 19 in FIG. 2d.

The protective layer produced in the remaining void 16b of the trench 10 should cover at least the insulation layer 19 above the first electrode 15 in order to secure the retention thereof during a later removal process. In the example illustrated, the protective layer even completely fills the void 16b. The protective layer is advantageously produced from a material which can be etched selectively with respect to the insulation layer 19. By way of example, the material used for the protective layer 18 is a resist or a carbon-containing material such as carbon or a polymer, for example, which is applied by spinning for example in liquid form into the void 16b and on the upper main surface of the insulation layer 19 and is cured.

This is followed, for example, by a process of etching back the resist with an end point on the main surface of the insulation layer, such that a resist plug remains in the void 16b, while the main surface of the insulation layer 19 is uncovered.

Figure 2E:
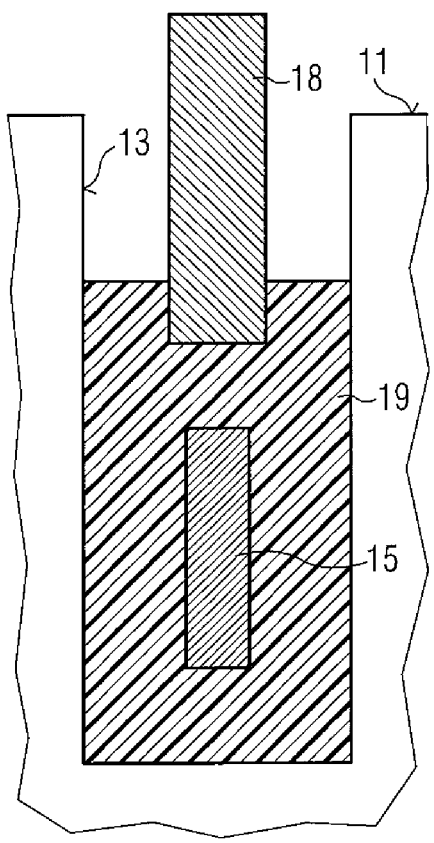

FIG. 2e then illustrates an advanced state in the method sequence, in which the insulation layer 19 has been removed along the protective layer plug 18 in the void 16b proceeding from the main surface into the trench 10. In this case, the removal is generally effected by selective etching of the insulation layer 19 relative to the semiconductor body and the protective layer 18. Particularly with the use of a resist as protective layer 18 and an SiO2 insulation layer 19, it is possible to achieve the selective etching firstly of the resist and then the selective etching of the SiO2 insulation layer 19 by merely changing over the etching parameters in the same etching process. This etching process is preferably effected only to an extent such that the protective layer 18 in the trench 10 is not completely uncovered, but rather is at least still partly situated in the insulation layer 19.

As illustrated in FIG. 2e, as a result of this selective etching process, a virtually completely uncovered protective layer plug 18 remains above the first electrode 15 with a further insulation layer 19 present in its original thickness D on the first electrode 15. The surface 11 of the semiconductor body 10 and a portion of the side areas 13 of the semiconductor body in the upper part 10b of the trench 10 are uncovered.

Figure 2F:
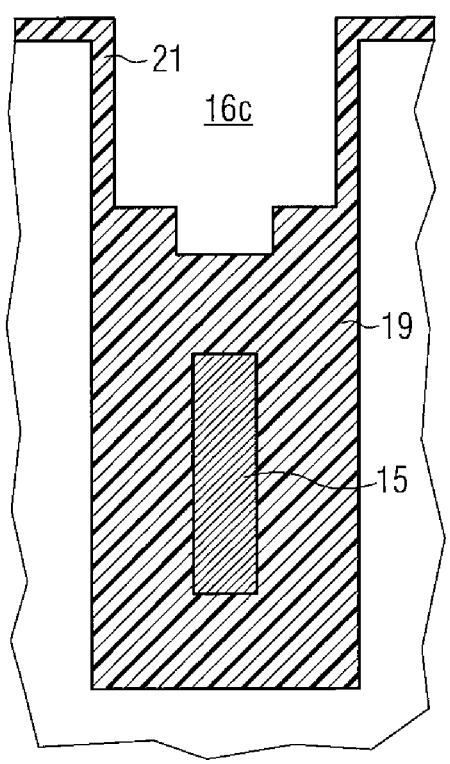

As illustrated in FIG. 2f, the protective layer 18 is removed. This generally takes place once again in the same etching process, as described above, by renewed changeover of the etching parameters. The resist is incinerated, for example, in this case. However, a separate removal process can also be used. This is followed by production of a thin insulation layer 21, for example a gate dielectric, at the uncovered sidewalls 13 of the semiconductor body, as illustrated in FIG. 2f. The void 16c now remaining free in the trench 10 above the first electrode 15 is then filled with a second electrode 20. The second electrode 20 is generally produced according to a known method for example for producing a gate electrode composed of polysilicon. Optionally, a thin insulation layer can also be produced above said second electrode 20 in the trench 10.

Figure 2G:
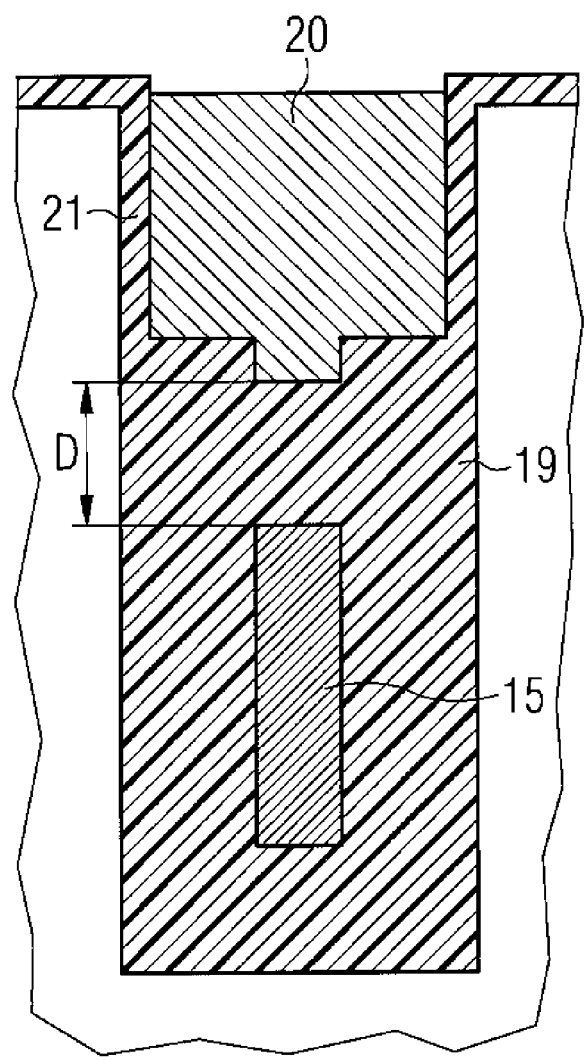

As illustrated in FIG. 2g, this results in an arrangement of two electrodes 15 and 20 in a trench 10 of a semiconductor body. The first electrode 15 is arranged in a lower part 10a of the trench and separated from the semiconductor body by a thick dielectric layer 19. The first electrode 15 can serve, for example, as a field electrode of a power semiconductor component, wherein the field electrode 15 then lies opposite a lightly doped drift path in the semiconductor body of the power semiconductor component, such as a power MOSFET, for example. The field electrode allows a higher dopant concentration in the drift path for a lower RDSon with at the same time a high breakdown voltage in the off-state case.

As illustrated in FIG. 2g, the second electrode 20, the gate electrode in the case of a MOSFET, for example, is arranged above the first electrode 15. The second electrode 20 is isolated from the channel region of the exemplary MOSFET by the thin insulation layer 21, for example gate oxide.

The two electrodes 20 and 15 are isolated from one another by the insulation layer 19 having a defined thickness D, produced according to the invention.

Owing to the production process, a step arises in the second electrode 20 at the bottom oriented towards the first electrode 15. The step forms if the selective etching of the insulation layer 19 along the protective layer 18 is stopped before reaching the lower end of the protective layer 18, as indicated in FIG. 2e.

What is claimed is:

1. A method for producing an insulation layer between a first electrode and a second electrode in a trench of a semiconductor body, the method comprising:
   providing a semiconductor body with a trench formed therein, wherein a first electrode is formed in a lower part of the trench;
   producing a first insulation layer having a first thickness on the first electrode and at the sidewalls of the trench in an upper part of the trench in such a way that the insulation layer is formed in a U-shaped fashion in the trench;
   producing a protective layer having a width substantially equal to a width of the first electrode on the insulation layer;
   removing the insulation layer at the sidewalls of the trench in an upper part of the trench above the lower surface of the protective layer;
   removing the protective layer;
   producing a second insulating layer having a second thickness being less than said first thickness only on the sidewalls of the trench; and
   producing a second electrode at least on the first and second insulation layers above the first electrode.

2. The method according to claim 1, wherein the production of the first insulation layer is effected by deposition of an insulation material on the first electrode and at the sidewalls of the trench.

3. The method according to claim 2, wherein the deposition is effected by a TEOS (tetraethoxysilane) deposition.

4. The method according to claim 1 wherein the production of the first insulation layer is effected conformally.

5. The method according to claim 1, wherein the protective layer is produced from a material which can be etched selectively with respect to the first insulation layer.

6. The method according to claim 1, wherein the protective layer completely fills the remaining void in the trench on the first insulation layer.

7. The method according to claim 1, wherein the first insulation layer is produced with a thickness D≥200 nm.

8. The method according to claim 1, wherein the first insulation layer is removed by selective etching relative to the semiconductor body and the protective layer.

9. The method according to claim 1, wherein the protective layer is produced from a carbon-containing material.

10. The method according to claim 9, wherein the carbon-containing material is carbon or a polymer.

11. A method, comprising:
   providing a semiconductor body with a trench formed therein;
   forming a first electrode in a lower part of the trench;
   producing a first insulation layer having a first thickness at least partially around the first electrode and on sidewalls of the trench;
   producing a protective layer having a width substantially equal to a width of the first electrode on the first insulation layer;
   removing at least a portion of the first insulation layer at the sidewalls of the trench above the lower surface of the protective layer;
   removing the protective layer;
   producing a second insulating layer having a second thickness being less than said first thickness only on the sidewalls of the trench; and
   producing a second electrode at least above the first electrode.

12. The method according to claim 11, wherein the producing of the first insulation layer produces the first insulation layer in a substantially U shape.

13. The method according to claim 11, wherein the producing of the first insulation layer produces the first insulation layer in an upper part of the trench.

14. The method according to claim 11, wherein the removing of the at least a portion of the first insulation layer removes the first insulation layer at sidewalls of the trench in an upper part of the trench.

15. The method according to claim 11, wherein the producing of the second electrode produces the second electrode on the first and second insulation layer above the first electrode.

16. The method according to claim 11, wherein the protective layer is produced from a material which can be etched selectively with respect to the first insulation layer.

17. The method according to claim 11, wherein the protective layer is produced from a carbon-containing material.

18. A semiconductor, comprising:
a trench formed in a semiconductor body;
a dielectric layer formed in the trench;
a first electrode arranged in a lower part of the trench and separated from the semiconductor body by the dielectric layer; and
a second electrode arranged above the first electrode and isolated from the first electrode by the dielectric layer, and the second electrode separated from the semiconductor body by the dielectric layer, the second electrode having a protrusion extending from a surface facing the first electrode, the protrusion having a width substantially equal to a width of the first electrode.

19. The semiconductor according to claim 18, wherein the first and second electrodes are separated by a gap of at least 200 nm.

* * * * *